Figure 1:
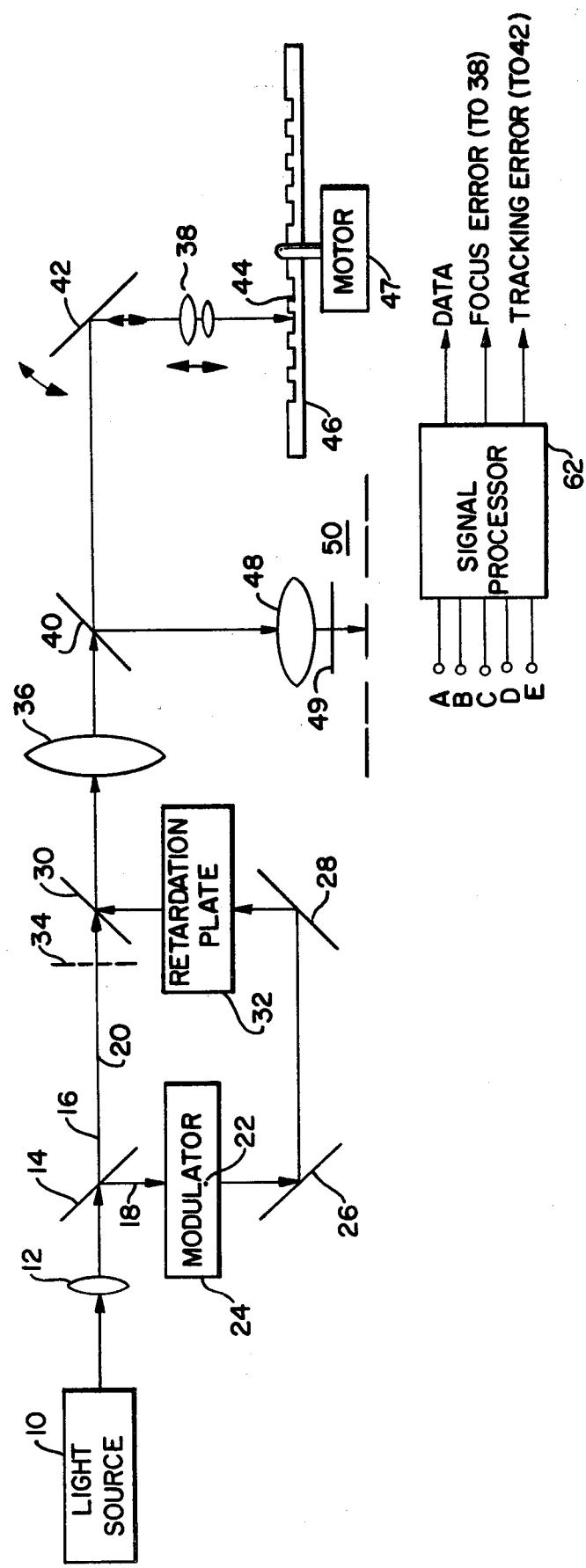

United States Patent [19]

Reilly et al.

[11] Patent Number: 4,464,567

[45] Date of Patent: Aug. 7, 1984

[54] PHOTOELECTRIC INFORMATION AND FOCUS DETECTOR

[75] Inventors: Charles Reilly; Leonard Laub, both of Pasadena; Krishna Swaminathan, Santa Monica, all of Calif.

[73] Assignee: Storage Technology Corporation, Louisville, Colo.

[21] Appl. No.: 279,101

[22] Filed: Jun. 30, 1981

[51] Int. Cl.³ .............................................. G01J 1/36
[52] U.S. Cl. ................................. 250/204; 369/45
[58] Field of Search ............... 250/201, 204, 209, 570, 250/578, 550; 369/44, 45, 46

[56] References Cited

U.S. PATENT DOCUMENTS 3,913,076 10/1975 Lehureau et al. .................. 369/46
4,006,293 2/1977 Bouwhuis et al. .................. 369/46
4,363,116 12/1982 Kleuters et al. .................... 369/45

*Primary Examiner*—David C. Nelms
*Attorney, Agent, or Firm*—Woodcock Washburn Kurtz Mackiewicz & Norris

[57] ABSTRACT

Apparatus for reading information stored in a track pattern on a radiation reflecting record comprises a source of radiation such as a laser, a diffraction grating for providing at least a zero order beam component and a pair of first order beam components, an objective lens assembly, a photodetector array, the photodetector array comprising a unitary data photodetector disposed for impingement of the zero order beam component for sensing stored information and at least first and second paired photodetector arrays adjacent to the data photodetector including separated sectors disposed along an axis including the data photodetector for providing at least focus error correction signals to the objective lens assembly, and means provided in the optical path between the objective lens assembly and the photodetector array for providing a first portion of the reading beam components which remains relatively fixed in size and a second portion of the reading beam components which varies substantially linearly in size as the record deviates from a plane of focus.

9 Claims, 2 Drawing Figures

PHOTOELECTRIC INFORMATION AND FOCUS DETECTOR

This invention relates to optical systems for retrieving information recorded in the form of a pattern on a record or disc (an optical data storage disc). More particularly, this invention relates to optical systems including photodetector arrays suitable for detecting the recorded data and for detecting positioning errors of the optical system with respect to the disc. Positioning errors along the optical axis of the system are manifest as focusing errors while those in a plane perpendicular to the optical axis (i.e., in the plane of the disc) are manifest as tracking errors.

The present technology for high density, serial optical data recording depends upon the focusing of a beam of light to a very small spot (e.g., of submicron diameter) in order to minimize the required laser power as well as to maximize data density. Whereas commerically available machines (such as those based upon consumer video playback apparatus) have employed objective lens numerical apertures of the order of 0.45, the application of optical recording technology to high density data should utilize numerical apertures significantly closer to the theoretical maximum (e.g., preferably 0.95). The resulting small spot size, however, is not realized without attendant problems since the focusing and tracking problems associated with high numerical aperture optics and imperfect (uneven) discs are more severe. Thus improved optical systems, including detector geometries for high density data, as well as stringent focus and tracking error detection, are required.

It is known from numerous references (see, for example U.S. Pat. Nos. 4,025,949 and 4,079,247) that one can generate an optical focus error signal by introducing astigmatism into the beam reflected back from the recording medium to produce a diamond-shaped image which varies in size according to the defocusing of the beam (see H. Kogelnik and T. Li, *Applied Optics,* Vol. 5, No. 10, Page 1550 and copending U.S. patent application Ser. No. (STAR 02) of Reilly, Laub and Rose).

It is also known that higher order spots can be produced by diffracting the read beam and, with the aid of additional sets of detectors arranged adjacent a quadrant detector, information may be obtained regarding the magnitude and direction of radial tracking errors (J. Braat and G. Bouwhius, *Applied Optics,* Vol. 17, No. 13, Page 2013).

In addition to the astigmatic focus error detection arrangements noted above, it is also known (see G. Bouwhius and J. Braat, *Applied Optics,* Volume 17, No. 12, page 1998) that one can obtain focus error information from a pair of first order spots incident on pairs of detectors adjacent to the main data detector by a so-called "skew beam method". The first order spots are produced by means of an optical diffraction grating in the reading beam path. The spots are arranged to fall equally on each of the focus error detectors when nominal distance exists between the objective lens and the recording medium. Any deviation from the nominal distance causes a change in the distance between the zero order spots and first order spots at the recording medium. This causes a similar change in the spot separation at the pairs of detectors and a resultant difference in energy impinging on the individual detectors of each pair. This difference may be sensed to correct focus error (see also U.S. Pat. No. 4,135,207—Greve et al.).

However, for the skew beam focus system to provide an accurate measure of focus error over a reasonable range, the power in the two first order beams preferably should be constant and equal. Alternatively, a normalized focus error signal may be obtained by combining the difference derived from one pair of the first order beam detectors with the difference from the second pair of first order detectors and, by dividing that combination by the sum of the outputs of all four elements of the pairs, a normalized focus error signal may be obtained. Even such a normalized focus error will be subject to undesired inaccuracies since, after a small amount of defocus, the combined difference components and the total sum components each change with defocus. It has also been observed that, where very small spot sizes (less than 1 $\mu$m) of the type required for high density data recording are used, the minimum focused spot size may be so small as to inhibit its detection by means of a split detector. Additionally, any errors in the positions of first order spots relative to the associated detector pairs results in a false focus error signal. For example, misadjustment of the diffraction grating can result in a "rotation" of the first order beams around the zero order beam. With the conventional types of paired (split) focus error detectors, such first order beam rotation can produce erroneous focus error indications.

In accordance with the present invention, apparatus for recording information stored in a track pattern on a radiation reflecting record comprises a source of radiation such as a laser for supplying at least a reading beam. A diffraction grating is provided in the optical path of the reading beam for providing at least a zero order beam component and a pair of first order beam components. An objective lens means is provided for passing the reading beam components to the record and for controllably focusing the reading beam components at a plane of focus. A photodetector array is disposed in an optical path which includes the objective lens means. The photodetector array comprises a unitary data photodetector disposed for impingement thereon of the zero order reading beam component for sensing the recorded information and at least first and second paired photodetector arrays adjacent to the data photodetector. The paired photodetector arrays include separated sectors disposed along an axis including the data photodetector for sensing relative differences of the first order beams impinging on the elements of each pair to provide at least focus error correction signals to the objective lens means. Means are provided in the optical path between the focal plane of the objective lens means and the photodetector array for providing a first portion of the reading beam components which remains relatively fixed in size and a second portion of the reading beam components which varies substantially linearly in size as said record deviates from said plane of focus.

Figure 2:
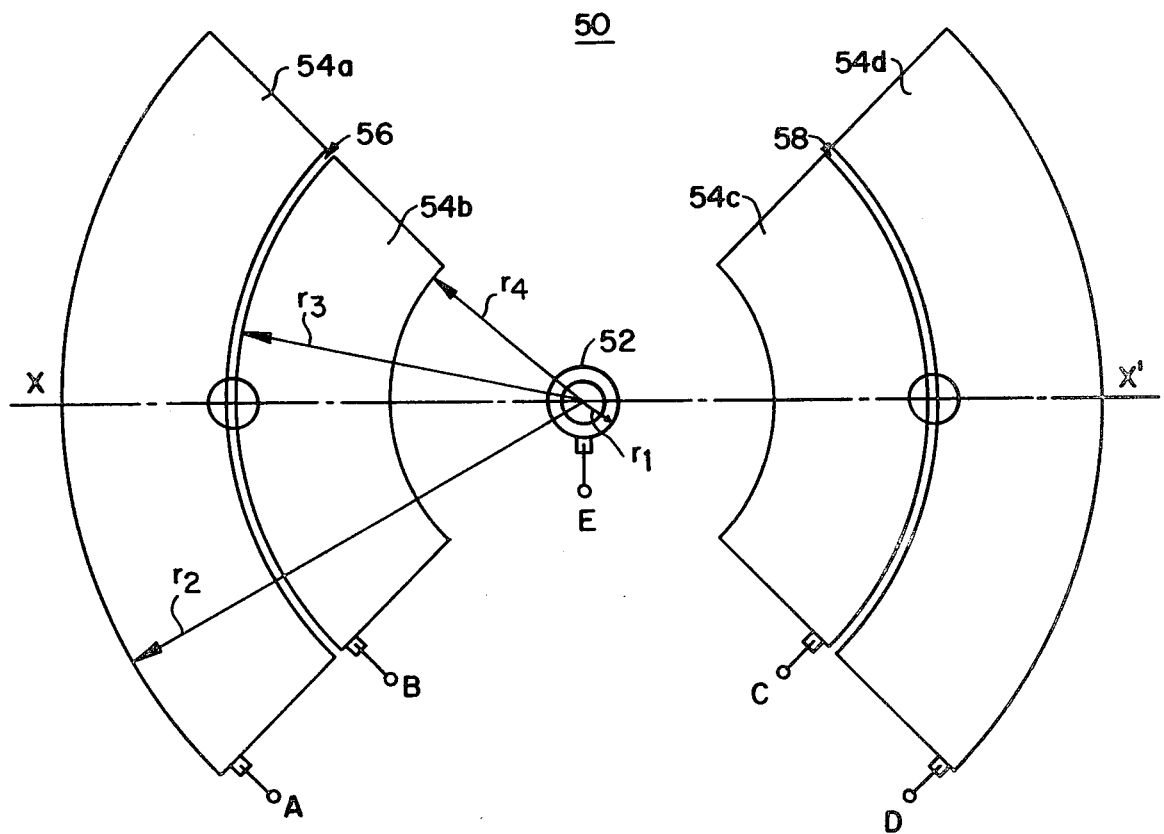

These and other aspects of the present invention will become apparent from a consideration of the following description and the attached drawing in which:

FIG. 1 illustrates in schematic diagram form a direct read after write (DRAW) apparatus embodying the invention; and FIG. 2 shows a detection system for use in the apparatus of FIG. 1.

Referring to FIG. 1, in a direct read after write (DRAW) system for storing and retrieving information, a source of illumination 10, for example a HeNe gas laser or an AlGaAs diode laser, emits radiation which is focused by a lens 12. The resulting focused beam is split by a partially transmitting mirror 14 into a read beam 16 and a write beam 18. The read beam 16 is focused at a position 20 while the write beam 18 is focused at a position 22. If the source of illumination 10 is not capable of being modulated internally, then the write beam 18 is modulated in accordance with the information to be recorded by an active optical modulating device 24 such as an acousto-optic or electro-optic modulator. The modulated write beam output of modulating device 24 is reflected by mirrors 26, 28 to a beam combiner 39 such as a partially transmitting mirror. Typically, a wave retardation plate 32 is inserted in the write beam path and, in that case, combiner 30 may be a polarization beam combiner.

The read beam 16, after being brought to a focus at position 20, is diffracted, for example, by a diffraction grating 34 to provide at least a zero order beam component and a pair of first order beam components. It should be noted that the diffraction function can be accomplished at other points in the system as will be apparent to persons familiar with this art. In the arrangement shown in FIG. 1, the diffracted and undiffracted beam components are each transmitted by combiner 30.

The combined read and write radiation passes through a lens system 36 which optimizes the diameter and wave front of the radiation for passage through a positionable objective lens system 38. After passing through lens system 38, the combined radiation passes through a further partially transmitting mirror 40 and is reflected by a controllably positioned device 42 such as a mirror mounted on a galvanometer. Device 42 will hereinafter be referred to as tracking mirror 42.

The read and write beams reflected by tracking mirror 42 are then focused by the objective lens system 38 at a recording medium 44. Recording medium 44 is disposed on a rotatable disc 46. A motor 47 drives the disc 46 in a predetermined manner.

The spatial separation between the zero order read beam spot and either of the first order read beam spots at the recording medium 44 is of the order of a few microns and is determined by the distance between focus 20 and grating 34, the efl of lens 36, the efl of objective 38, the grating frequency (of grating 34) and the wavelength of the radiation of read beam 16.

A portion of the read beam radiation is reflected by the recording medium 44, collected by the objective lens system 38, reflected by the tracking mirror 42, and reflected by the partially transmitting mirror 40 into a detection path including a lens assembly 48 and a detector array 50.

A plan view of detector array 50 is shown in FIG. 2. As shown in FIG. 2, and in accordance with one aspect of the present invention, detector array 50 comprises a unitary photosensitive data detection element 52 arranged for impingement by a zero order reflected beam component and having an effective outer radius of a first value $r_1$ associated with its data detection area. Detector array 50 further comprises a first pair of photodetector sectors 54a, 54b and a second pair of photodetector sectors 54c, 54d disposed along an axis X—X' which is common to data photodetector 52. The sectors 54a and 54d are quadrant portions of an annular region having an outer radius $r_2$. Sectors 54b and 54c are quadrant portions of an annular region having an outer radius $r_3$ and an inner radius $r_4$, where $r_2 > r_3 > r_4 > r_1$. The outer sectors 54a, 54d are concentric with the inner sectors 54b, 54c, as well as with data photodetector 52. Output electrodes A, B, C, D, E are associated, respectively with sectors 54a, 54b, 54c, 54d are data photodetector 52.

The pairs of photodetector sectors 54a, 54b and 54c, 54d are appropriately spaced for impingement thereon of the first order beam components as will appear below. Annular spaces 58 and 56 which separate the photodetectors of a pair are arranged for impingement thereon of the center of first order beam components when a proper focus condition is obtained. As noted above, output signals are derived from each of the detector elements at output terminals A, B, C, D, and E as shown in FIG. 2. The respective output signals are combined in a signal processor 62 (FIG. 1) to produce a data signal output and a focus error output as will appear below.

In the operation of the apparatus of FIGS. 1 and 2, the spatial separation at detector array 50 between the zero order reflected spot, which is shown superimposed on data photodetector 52, and the first order reflected spots, which are shown for the condition of proper focus (i.e., centered on spaces 56 and 58), is determined by the magnification of the optical train from the recording medium 44 to the detector array 50 and by the spatial separation of the zero and first order beam spots at the recording medium 44. As the recording medium 44 moves out of the focal plane of objective lens 38 in one direction, the separation between zero and first order spots along axis X—X' increases (i.e., when recording medium 44 is further away from objective lens 38 than would be the case for proper focus). A greater portion of the first order beams then falls upon detector sectors 54a, 54d. When the recording medium 44 moves out of the focal plane in the opposite direction (i.e., towards objective lens 38), the separation along axis X—X' decreases and a greater portion of the first order beams falls on detector sectors 54b, 54c. Stated in terms of the power incident on the sectors of the photodetector 54, a focus error signal (FES) may be expressed as $$FES = (P_{54a} - P_{54b}) + (P_{54d} - P_{54c})$$

where, for example $P_{54a}$ refers to the output of photodetector element 54a.

The focus error signal may thus be derived by simple algebraic combination in signal processor 62 of the outputs of the four photodetector elements 54a–54d according to the foregoing expression. The focus error signal is applied in a well-known manner to, for example, a voice coil motor assembly (not shown) associated with movable objective lens assembly 38 to maintain the desired focused condition at recording medium 44.

In the event of any rotational misalignment of grating 34, the first order beam components will shift along the annular spaces 56, 58 thereby not changing the relationships expressed in the equation above. This is to be compared with the prior known arrangements wherein spaces between the pairs of focus error detector elements would lie along lines perpendicular to axis X—X' (rather than along the curved space of the illustrated arrangement). A single data signal lead E is associated with data detector element 52. The zero order spot is incident on data detector element 52 and that element 52 is dimensioned slightly larger (e.g., approximately 15% larger) in diameter than the incident beam in order to avoid edge effects and to permit the data signal output to be of relatively unvarying maximum amplitude (e.g., within ±2%) over the control range of the focusing system, while minimizing noise generated by detector element 52.

The surrounding pie-shaped sector detector elements 54a–54d are, as is desired, of greater diameter than the data element 52 to provide an adequate capture range for the focus control arrangement.

A normalized focus error signal may be derived according to the following relationships of the power incident on the several sectors of the illustrated photodetector arrangement:

$$FES = \frac{(P_{54a} - P_{54b}) + (P_{54d} - P_{54c})}{(P_{54a} + P_{54b}) + (P_{54c} + P_{54d})}$$

After a small amount of defocus, both the separation between zero and first order spots and the size of these spots changes linearly with defocus. It is therefore desireable to reduce the effects of changes in spot size as focus changes. One solution is to position a scatter plate 49 prior to the detector array 50, see FIG. 1. This causes the spots incident on the detector array 50 to be comprised of two components: one component which is fixed in size, the other component grows linearly with defocus. The size of the fixed component is determined by the position and makeup of the scattering plate 49. By adjusting, for example the position of 49, one can trade off slope against capture range on the normalized focus error signal. The scattering plate 49 may be formed, for example, of a separate piece of ground glass or it may be incorporated on one surface of lens 48. In any event, scattering plate 49 should be arranged so that, even at the perfect focus condition of the spots on detector 50, the minimum size of such spots is greater than the separation 56,58 between the pairs of detector sectors. An additional benefit of scatter plate 49 is that it precludes unwanted concentration of reading beam energy on the photodetector elements which energy, in some circumstances, could be harmful to the photodetector elements.

Alternatively, the objective lens assembly 38 may be arranged to truncate the pair of skewed first order beams when it is collecting the light reflected from the recording medium 44. One can cause the first order spots incident on the detector array 50 to be comprised of two components as stated above by choice of the angle between the zero and first order beams at the recording medium 44.

What is claimed is:

1. Apparatus for reading information stored in a track pattern on a radiation reflecting record comprising:
    a source of radiation for supplying at least a reading beam;
    a diffraction grating disposed in the optical path of said reading beam for providing at least a zero order beam component and a pair of first order bean components;
    an objective lens means for passing said reading beam components to said record and for controllably focusing said reading beam components at a plane of focus;
    a photodetector array disposed in an optical path which includes said objective lens means, said photodetector array comprising a unitary data photodetector disposed for impingement thereon of said zero order reading beam component for sensing said stored information and at least first and second paired photodetector arrays adjacent to said data photodetector, said paired photodetector arrays including separated sectors disposed along an axis including said data photodetector for sensing relative differences of said first order beams impinging on said sectors of each pair to provide at least focus error correction signals to said objective lens means; and
    means provided in the optical path between the focal plane of said objective lens means and said photodetector array for providing a first portion of said reading beam components which has a minimum size greater than the separation between the ones of said pairs of photodetectors and a second portion of said reading beam components which varies substantially linearly in size as said record deivates from said plane of focus.

2. Apparatus according to claim 1 wherein said means for providing first and second portions of said reading beam components comprises light scattering means for providing a minimum spot diameter for said first order beam components greater than the distance between said separated sectors along said axis.

3. Apparatus according to claim 2 wherein said light scattering means comprises an optical element having a ground surface in the light path to said photodetector array.

4. Apparatus according to claim 1 wherein said means for providing first and second portions of said reading beam components comprises a scatter plate having a ground surface.

5. Apparatus according to claim 1 wherein said separated sectors are each disposed concentrically to said data photodetector and to each other.

6. Apparatus for reading information stored in a track pattern on a radiation reflecting record comprising:
    a source of radiation for supplying at least a reading beam;
    a diffraction grating provided in the optical path of said reading beam for providing at least a zero order beam component and a pair of first order beam components;
    an objective lens means for passing said reading beam components to said record and for controllably focusing said reading beam components at a plane of focus; and
    a photodetector array disposed in an optical path which includes said objective lens means, said photodetector array comprising a unitary data photodetector disposed for impingement thereon of said zero order reading beam component for sensing said recorded information and at least first and second paired photodetector arrays adjacent to said data photodetector, said paired photodetector arrays including separated sectors disposed along an axis including said data photodetector for sensing relative differences of said first order beams impinging on said sectors of each pair to provide at least focus error correction signals to said objective lens means, said separated sectors each being disposed concentrically to said data photodetector and to each other.

7. Apparatus according to claim 6 wherein:
    said data photodetector in substantially circular having a radius $r_1$ and said separated sectors are each substantially quadrants of a circle.

8. Apparatus according to claim 7 wherein said paired photodetector arrays each comprise a first sector having an outer radius $r_2$ and a second sector having an outer radius $r_3$ and an inner radius $r_4$ wherein said inner radius $r_4$ is greater than $r_1$.

9. Apparatus according to claim 7 wherein said quadrants are symmetrically disposed relative to said axis.

* * * * *